United States Patent [19]
Tseng

[11] Patent Number: 5,926,710
[45] Date of Patent: Jul. 20, 1999

[54] METHOD FOR MAKING DYNAMIC RANDOM ACCESS MEMORY CELLS USING A NOVEL STACKED CAPACITOR PROCESS

[75] Inventor: Horng-Huei Tseng, Hsinchu, Taiwan

[73] Assignee: Vanguard International Semiconductor Corporation, Hsin-Chu, Taiwan

[21] Appl. No.: 08/956,968

[22] Filed: Oct. 23, 1997

[51] Int. Cl.$^6$ .............................................. H01L 21/8242
[52] U.S. Cl. .......................................... 438/253; 438/631
[58] Field of Search .................................. 438/241, 253, 438/396, 626, 631, 645

[56] References Cited

U.S. PATENT DOCUMENTS

| 5,399,518 | 3/1995 | Sim et al. | 437/52 |
|---|---|---|---|
| 5,468,670 | 11/1995 | Ryou | 438/253 |
| 5,545,582 | 8/1996 | Roh | 437/52 |
| 5,604,146 | 2/1997 | Tseng | 437/52 |
| 5,759,888 | 6/1998 | Wang et al. | 438/253 |
| 5,792,688 | 8/1998 | Tseng | 438/253 |

*Primary Examiner*—Chandra Chaudhari
*Attorney, Agent, or Firm*—George O. Saile; Stephen B. Ackerman

[57] ABSTRACT

A method is described for making an array of DRAM cells having increased capacitance. The method forms a planar insulating layer over FETs in an array of cells. Node contact openings are etched to each FET. A thick first polysilicon layer is deposited to fill the node contact openings and provide a planar polysilicon surface on the insulating layer. A thin silicon nitride layer is deposited on the first polysilicon layer, and both are patterned leaving portions having essentially vertical sidewalls over the contact openings. Polysilicon oxide sidewalls are formed on the first polysilicon layer by thermal oxidation. The nitride layer prevents oxidation of the top of the polysilicon. The nitride is removed and the polysilicon is selectively etched (recessed) leaving polysilicon oxide sidewalls. A second polysilicon layer is deposited over the oxide sidewalls and etched back to form inner and outer sidewall spacers. The oxide sidewalls and portions of the planar insulating layer are etched, lifting off the outer polysilicon sidewall spacers to provide a capacitor bottom electrode having vertical sidewalls. A thin capacitor dielectric layer is formed on the bottom electrodes and a third polysilicon layer is deposited and patterned to form the top electrodes and to complete the array of stacked capacitors on the DRAM device.

23 Claims, 5 Drawing Sheets

METHOD FOR MAKING DYNAMIC RANDOM ACCESS MEMORY CELLS USING A NOVEL STACKED CAPACITOR PROCESS

BACKGROUND OF THE INVENTION

(1) Field of the Invention

The present invention relates to integrated circuits built on semiconductor substrates, and more particularly to a method for fabricating dynamic random access memory (DRAM) using a novel stacked capacitor process for increased capacitance and increased memory cell density.

(2) Description of the Prior Art

The circuit density on integrated circuits has continually increased over the years due to innovations in process technologies. One particular device with increased density is the dynamic random access memory (DRAM), which is expected to have more than a billion memory cells (gigabits) by the year 2000 or shortly thereafter. This higher density of memory cells is a result of improved high resolution photolithography and patterning by directional (anisotropic) plasma etching, which result in reduced device sizes. However, this reduction in device size is putting additional demand on the semiconductor processing technologies, and also on maintaining the electrical requirements, such as maintaining or increasing the capacitance of capacitors on DRAM devices.

These DRAM devices consist in part of an array of individual DRAM storage cells that store binary data (bits) as electrical charge on a storage capacitor. Further, the information is stored and retrieved from the storage capacitor by means of a single pass transistor in each memory cell, and by address and read/write circuits on the periphery of the DRAM chip. The pass transistor is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires increased refresh cycles that periodically restore the charge on these volatile storage cells. This further reduces the performance of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the pass transistors within each cell area, rather than forming trench capacitors which need to be etched to increasing depths in the substrate to maintain the necessary capacitance. The stacked capacitors provide increased latitude in capacitor design and processing while reducing cell area. More specifically, the stacked capacitors can be built in the vertical extensions (third dimension) to increase the stacked capacitor area, and therefore to increase the capacitance.

Numerous methods have been reported in the literature for making stacked storage capacitors with vertical structures to increase capacitance and packing density of the DRAM cells. In U.S. Pat. No. 5,399,518 Sim et al. teach a method for making a multiple walled capacitor using sidewall spacers as a mask to pattern the bottom electrode for the capacitor. Another approach is taught by Roh in U.S. Pat. No. 5,545,582 in which a first material layer is deposited on a node first conductive layer and patterned. Then a series of depositions and anisotropic etchbacks are used to form vertical sidewalls for the bottom electrode (node electrode) resulting in a double-walled capacitor. Another approach is taught by Tseng, U.S. Pat. No. 5,604,146, in which an E-shaped storage capacitor is formed having a vertical wall self-aligned to a center plug (post).

However, to be cost competitive in making DRAMs, it is very desirable to further increase the capacitance while simplifying the manufacturing process.

SUMMARY OF THE INVENTION

Accordingly it is a principal object of the present invention to provide DRAMs with increased capacitance while minimizing the process complexity.

A method is described for making dynamic random access memory (DRAM) cells with increased capacitance. The method begins by providing a semiconductor substrate. Typically the substrate is a single-crystal silicon substrate doped with a P-type conductive dopant, such as boron (B). A relatively thick Field OXide (FOX) is formed surrounding and electrically isolating each device area. The field oxide is typically formed using the LOCal Oxidation of Silicon (LOCOS) method in which a patterned silicon nitride ($Si_3N_4$) layer is used to mask the device areas from oxidation while the silicon substrate in the FOX areas is thermally oxidized to the desired thickness. Other FOX isolations can also be used, such as shallow trench isolation (STI) and the like. A thin gate oxide is formed in the device areas on the silicon substrate for the FETs. Then an electrically conducting layer, such as polysilicon or polycide (polysilicon/silicide) layer, having a cap oxide (silicon oxide) thereon is patterned to form the FET gate electrodes and the interconnecting word lines for the DRAM cells. Source/drain areas adjacent to the gate electrodes are formed for the FETs. The source/drain areas are formed by ion implantation and are self-aligned to the FET gate electrodes. For FETs having very narrow channel lengths (under the narrow gate electrodes), the source/drain areas include lightly doped drain areas to minimize short-channel effects. A first insulating layer, composed of a silicon oxide ($SiO_2$) layer and a $Si_3N_4$ layer, is deposited over the device areas and the field oxide areas. A thicker second insulating layer is deposited and planarized on the first insulating layer. Contact openings are etched in the second and first insulating layers to the device areas where electrical contacts are desired for the stacked capacitors (to one of the two source/drain areas of the FET in each of the DRAM cells).

The novel stacked capacitors, by the method of this invention, are now formed by depositing a relatively thick conductively doped first polysilicon layer on the second insulating layer over the device areas and over the field oxide areas, making contact to the device areas through the (node) contact openings in the first and second insulating layers. A relatively thin third insulating layer composed of $Si_3N_4$ is deposited on the first polysilicon layer. The third insulating layer and the first polysilicon layer are patterned using conventional photolithographic techniques and anisotropic etching to the second insulating layer, leaving portions of the third insulating layer and first polysilicon layer having essentially vertical sidewalls over the contact openings. The first polysilicon layer is then thermally oxidized to form polysilicon oxide sidewalls on the sidewalls of the portions of the first polysilicon layer over each memory cell area. The $Si_3N_4$ third insulating layer prevents oxidation of the top surface of the patterned first polysilicon layer over each memory cell area during the thermal oxidation. An anisotropic plasma etching is used to etch the $Si_3N_4$ third insulating layer and to selectively etch (recess) relative to the polysilicon oxide sidewalls the portions of the first polysilicon layer over the contact openings. This results in vertical polysilicon oxide sidewalls while retaining a portion of the first polysilicon layer within the sidewalls and in the contact openings. A conductively doped second polysilicon layer is conformally deposited over the polysilicon oxide sidewalls, and the second polysilicon layer is then anisotropically etched back to expose the top surface of the polysilicon oxide sidewalls. This forms an outer polysilicon spacer and an inner polysilicon spacer on the polysilicon oxide sidewalls. The inner polysilicon spacers make contact to the first polysilicon layer, while the outer spacers are formed over the second insulating layer. This allows the outer polysilicon spacers formed from the second polysilicon layer to be selectively removed using an isotropic etch, retaining the inner polysilicon spacers aligned over the portions of the first polysilicon layer. Continuing with the process, an isotropic etch, such as a hydrofluoric (HF) acid solution, is used to selectively etch the polysilicon oxide sidewalls and concurrently etch portions of the second insulating layer to lift off the outer polysilicon spacers. This results in the formation of bottom electrodes (node electrodes) having vertical sidewalls formed from the inner polysilicon spacers, resulting in increased area (capacitance) for the stacked capacitors. The array of stacked capacitors is now completed by forming a thin capacitor dielectric layer having a high dielectric constant on the bottom electrodes. A conductively doped third polysilicon layer is deposited and patterned to form top electrodes to complete the array of stacked capacitors for the dynamic random access memory devices.

BRIEF DESCRIPTION OF THE DRAWINGS

The objects and advantages of this invention are best understood with reference to the attached drawings in FIGS. 1 through 9, and the embodiment that follows.

DESCRIPTION OF THE PREFERRED EMBODIMENT

The method for making the DRAM cells having these improved capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Figure 1:
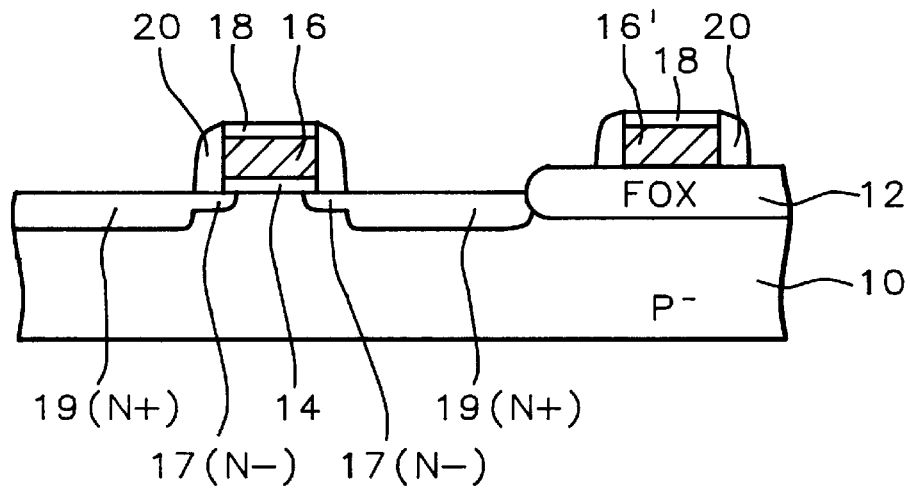
FIGS. 1 through 9 show schematic cross-sectional views for one of the cell regions of an array of DRAM cells illustrating the fabrication steps for making the stacked storage capacitor of this invention.

Referring now to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P-type single-crystal silicon having a <100> crystallographic orientation. A relatively thick Field OXide (FOX) 12 is formed to surround and electrically isolate the individual device regions in which the memory cells are built. The field oxide 12, which is only partially shown in FIG. 1, is most commonly formed by the LOCal Oxidation of Silicon (LOCOS) method. Briefly the LOCOS method uses a thin $SiO_2$ (pad oxide) as a stress release layer and a thicker $Si_3N_4$ layer that serves as an oxidation barrier layer on the pad oxide on the substrate surface (not shown in FIG. 1). Conventional photolithographic techniques and etching are used to remove the $Si_3N_4$ barrier layer in areas where a field oxide is required, while retaining the $Si_3N_4$ over the active device areas to prevent oxidation. The silicon substrate is then thermally oxidized to form the FOX areas 12. The FOX is usually grown to a thickness of between about 3000 and 6000 Angstroms, and the $Si_3N_4$ barrier layer and pad oxide are removed in a wet etch. For example, the nitride can be removed in a hot phosphoric acid ($H_3PO_4$) etch, and the pad oxide can be removed in a dilute solution of hydrofluoric acid and water ($HF/H_2O$). Other field oxide isolation methods can be used which allow even more closely spaced device areas and higher cell density. For example shallow trench isolation (STI) and the like can be used with this invention.

An array of access transistors (N-channel FETs) is now formed in the active device regions, one of which is shown in FIG. 1. The surface of the silicon substrate 10 in the device area is thermally oxidized to form a thin gate oxide 14 for the N-channel FET. The gate oxide 14 is grown to a thickness of between about 50 and 150 Angstroms. An electrically conducting layer 16 having a cap oxide 18 is deposited and patterned to form the FET gate electrodes 16 over the device areas and to form the interconnecting word lines 16' over the field oxide for the DRAM cells. Layer 16 is composed of a heavily doped polysilicon layer deposited by low pressure chemical vapor deposited (LPCVD) and deposited to a preferred thickness of between about 1500 and 3500 Angstroms. For example, the polysilicon layer can be conductively doped with arsenic (As) or phosphorus (P) to a concentration of between about $1.0 \text{ E } 19$ and $1.0 \text{ E } 21$ atoms/cm$^3$. Alternatively, layer 16 can be a polycide (polysilicon/refractory metal silicide) layer to improve the electrical conductivity. For example, a tungsten silicide ($WSi_2$) layer can be deposited by CVD using a reactant gas such as tungsten hexafluoride ($WF_6$). Typically, the $WSi_2$ is deposited to a thickness of between about 500 and 1500 Angstroms, providing a polycide layer having a total thickness of between about 1500 and 3500 Angstroms. A cap oxide layer 18, composed of $SiO_2$, is deposited next on layer 16 by LPCVD and the decomposition of a reactant gas, such as tetraethosiloxane (TEOS). Typically, the thickness of the cap oxide layer 18 is between about 600 and 2000 Angstroms. Conventional photolithographic techniques and anisotropic plasma etching are then used to pattern the conducting layer 16 to form the gate electrodes 16 with a cap oxide 18, as shown in FIG. 1.

Still referring to FIG. 1, source/drain areas are formed adjacent to the gate electrodes and typically include lightly doped source/drain areas to minimize short-channel effects for sub-half-micron channel FETs. The lightly doped source/drain areas 17(N$^-$) are formed first by ion implantation and are self-aligned to the FET gate electrodes 16. The lightly doped source/drain areas 17 for N-channel FETs, typically used as the access transistors in DRAM cells, are formed by ion implantation of an N-type dopant, such as arsenic (As) or phosphorus (P). For example, a typical implant might consist of phosphorus $P^{31}$ at a dose of between about 1 E 13 and 1 E 14 atoms/cm$^2$ and at an energy of between about 20 and 40 KeV. The gate electrodes serve as an implant mask to self-align the lightly doped source/drain areas 17(N$^-$) to the gate electrodes while an additional patterned photoresist can be used to prevent implantation elsewhere on the substrate where it is not needed.

Sidewall spacers 20 are formed on the sidewalls of the gate electrode 16, as shown in FIG. 1. Typically the sidewall spacers 20 are formed by depositing a conformal low-temperature silicon oxide, such as TEOS oxide, and anisotropically blanket etching back the oxide to the surface of the substrate 10. For example, the sidewall oxide can be deposited using LPCVD and TEOS at a temperature in the range of about 650 to 900° C. The etchback is carried out in a reactive ion etcher (RIE) or high-density plasma (HDP) etcher using an etching gas such as $CHF_3$. An N$^+$ source/drain ion implantation is then used to complete the source/drain areas forming the N$^+$ doped source/drain contact areas 19 aligned to the sidewall spacers 20, and therefore also aligned to the lightly doped source/drain areas 17(N$^-$), as shown in FIG. 1. This completes the FET which serves as the access transistor in each of the memory cell areas.

Figure 2:
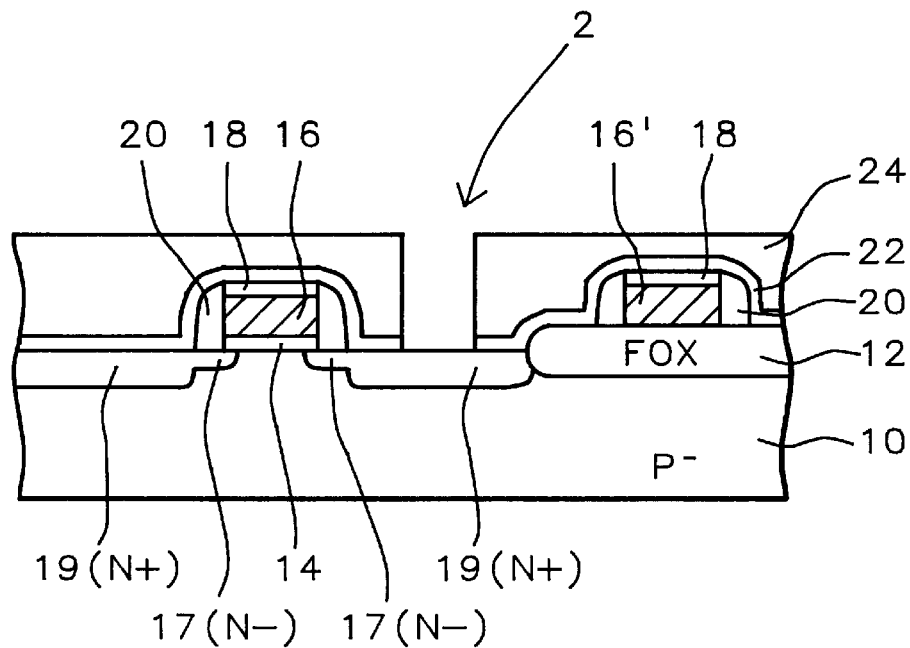

Referring now to FIG. 2, a first insulating layer 22, composed of a $SiO_2$ layer and an upper $Si_3N_4$ layer, is deposited conformally over the device areas and the field oxide areas to a thickness of between about 1000 and 2000 Angstroms. Preferably layer 22 is deposited by LPCVD using, for example, TEOS for depositing the $SiO_2$, and dichlorosilane ($SiCl_2H_2$) and ammonia ($NH_3$) for depositing the $Si_3N_4$. Next, a thicker second insulating layer 24, such as a chemically vapor deposited $SiO_2$ or a borophosphosilicate glass (BPSG), is deposited to a thickness of between about 2000 and 8000 Angstroms. Layer 24 is then planarized, for example by chemical/mechanical polishing (CMP). Conventional photolithographic techniques and anisotropic plasma etching are used to form node contact openings 2 in the second and first insulating layers (24 and 22) to one of the two source/drain contact areas 19(N$^+$) to provide node contacts for the stacked storage capacitors.

Figure 3:
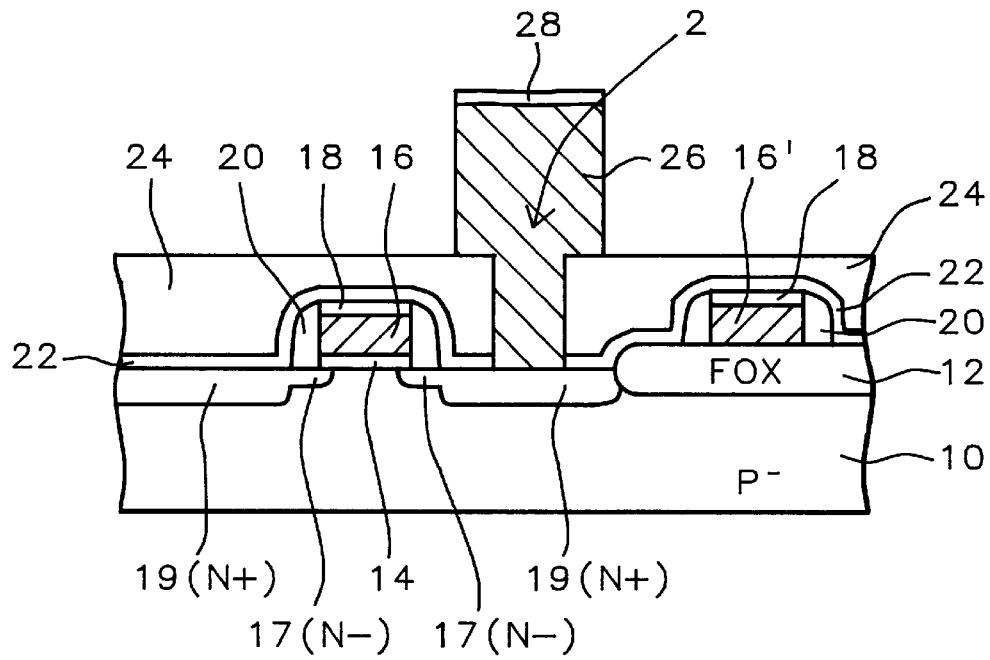

Referring next to FIG. 3, the stacked capacitors are formed by depositing a thick conductively doped first polysilicon layer 26 on the CVD $SiO_2$ or BPSG layer 24 by LPCVD using a reactant gas such as silane ($SiH_4$). The polysilicon layer 26 is doped either in situ during deposition or after deposition by ion implantation using an N type dopant such as phosphorus (P) and is doped to a concentration of between about 1.0 E 19 and 1.0 E 20 atoms/cm$^3$. The thickness of layer 26 is preferably between about 5000 and 10000 Angstroms. A relatively thin third insulating layer 28, composed of $Si_3N_4$ is deposited on the first polysilicon layer 26. Preferably the $Si_3N_4$ is deposited by LPCVD to a thickness of between about 200 and 1000 Angstroms.

The $Si_3N_4$ third insulating layer 28 and the first polysilicon layer 26 are patterned using conventional photolithographic techniques and anisotropic etching. Layers 28 and 26 are patterned using, for example, RIE or HDP etching to form portions of layers 28 and 26 having essentially vertical sidewalls over the node contact opening 2, as shown in FIG. 3. Preferably the etching is carried out using an etchant gas that provides a high etch rate selectivity of polysilicon to $SiO_2$ (or BPSG). For example, $CHF_3$ or $CF_4$ and hydrogen can be used for etching.

Figure 4:
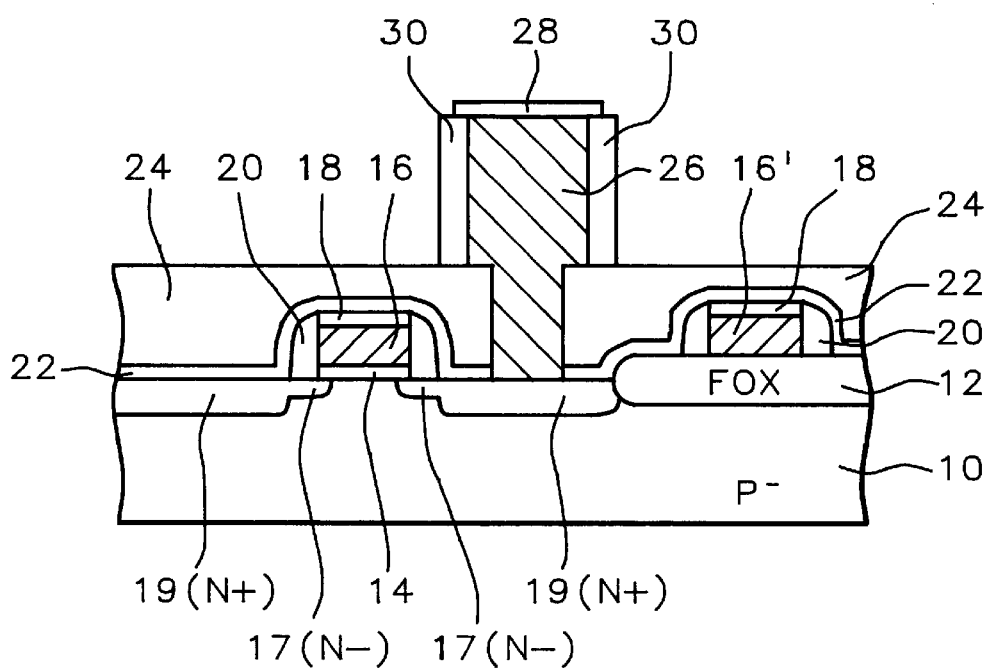

Referring to FIG. 4 and an important feature of the present invention, the first polysilicon layer 26 is thermally oxidized to form polysilicon oxide sidewalls 30 on the sidewalls of the portions of the first polysilicon layer 26 over each memory cell area, while the $Si_3N_4$ third insulating layer 28 prevents oxidation of the top surface of the patterned first polysilicon layer 26 during thermal oxidation. Preferably the thermal oxidation can be carried in an oxidation furnace using a dry oxidation in oxygen ($O_2$) or a wet (steam) oxidation. For example, the oxidation can be carried out using a temperature of between about 700 and 1000° C. for a time sufficient to grow a polysilicon oxide having a thickness of between about 100 and 1000 Angstroms.

Figure 5:
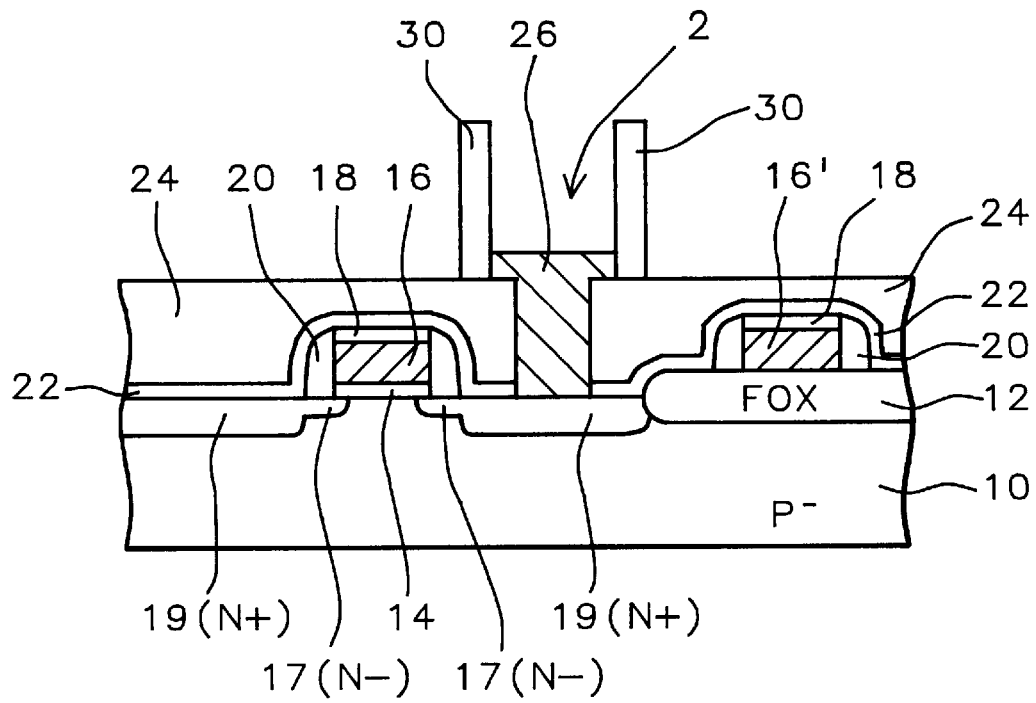

Referring now to FIG. 5, an anisotropic plasma etching is used to remove the $Si_3N_4$ third insulating layer 28 and to selectively etch (recess) the portions of the first polysilicon layer 26 while leaving relatively unetched the polysilicon oxide sidewalls 30. The polysilicon layer 26 is recessed as shown in FIG. 5 leaving a portion in and over the contact opening 2. Preferably the etching is carried out using a HDP etcher and an etchant gas such as chlorine/sulfur hexafluoride/hydrogen bromide ($Cl_2/SF_6/HBr$). This results in vertical polysilicon oxide sidewalls 30 while retaining a portion of the first polysilicon layer 26 within the sidewalls and in the contact opening 2.

Figure 6:
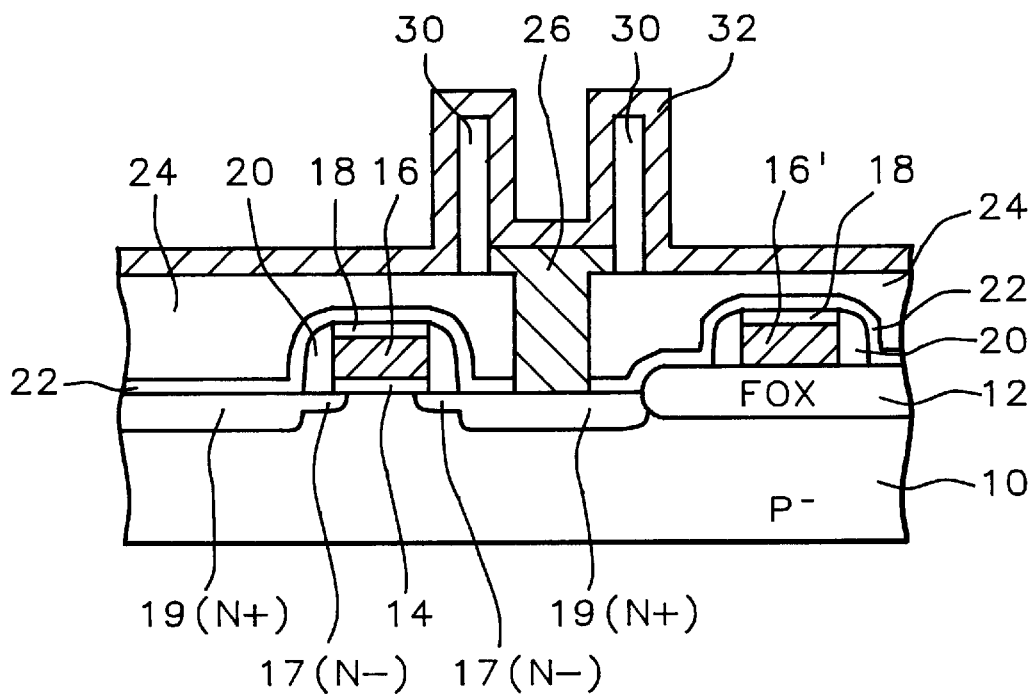

Referring to FIG. 6, a conductively doped second polysilicon layer 32 is deposited on the second insulating layer 24, the first polysilicon layer 26, and conformally over the polysilicon oxide sidewalls 30. The second polysilicon layer 32 is deposited by LPCVD to a thickness of between about 500 and 2000 Angstroms. Layer 32 is doped in situ with P during deposition using a dopant gas such as phosphine ($PH_3$), and is doped to a concentration of between about 1.0 E 19 and 1.0 E 21 atoms/cm$^3$.

Figure 7:
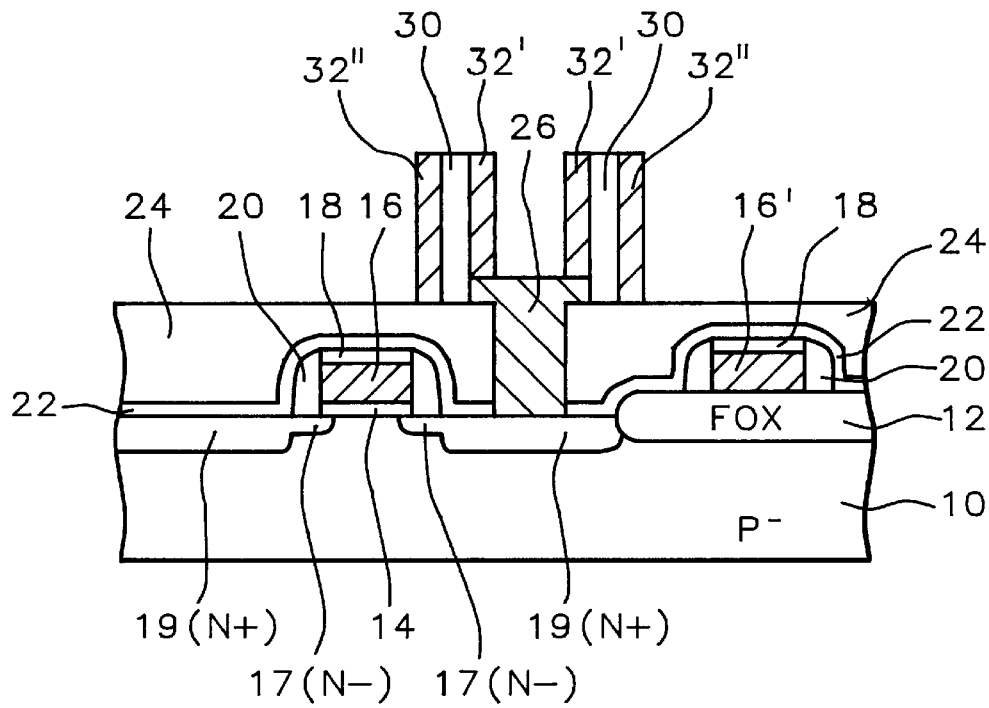

Next, referring to FIG. 7, the second polysilicon layer 32 is anisotropically etched back to expose the top surface of the polysilicon oxide sidewalls 30. The plasma etching is preferably carried out using a magnetically enhanced RIE (MERIE) and an etchant gas such as chlorine ($Cl_2$) and hydrogen bromide (HBr). This forms an inner polysilicon sidewall spacer 32' and an outer polysilicon sidewall spacer 32" on the polysilicon oxide sidewalls 30. The inner polysilicon spacers 32' make contact to the first polysilicon layer 26, while the outer spacers 32" are over the second insulating layer 24. An important feature of the invention is that the outer polysilicon spacers 32" formed from the second polysilicon layer 32 can be selectively removed using an isotropic etch, while retaining the inner polysilicon spacers 32' aligned over the portions of the first polysilicon layer 26, as shown in FIG. 8.

Figure 8:
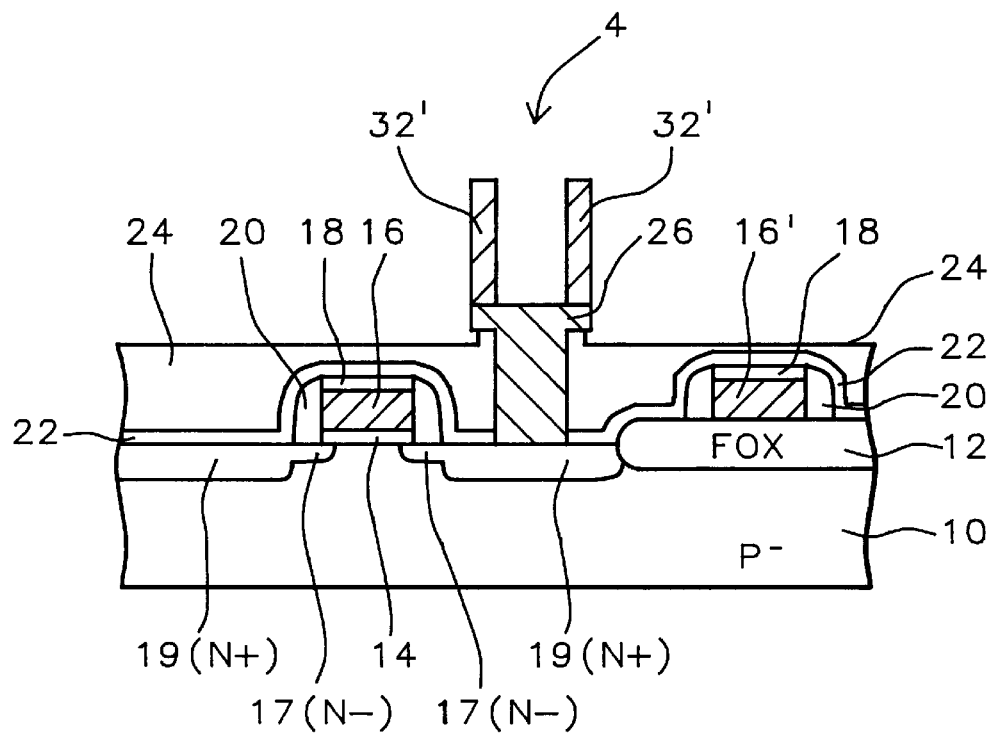

As shown now in FIG. 8, an isotropic etch, such as a hydrofluoric (HF) acid solution, is used to selectively etch the polysilicon oxide sidewalls (30 in FIG. 7) and concurrently etch portions of the second insulating layer 24 to lift off the outer polysilicon spacers (32"). This results in the formation of bottom electrodes 4 for the stacked capacitors having vertical sidewalls 32' formed from the inner polysilicon spacers 32'. For example, the etching can be carried out using a buffered HF acid etch, or in an HF/$H_2O$ solution. Alternatively, a HF acid vapor etch can be used. The etch-rate ratio of the polysilicon sidewalls 30 to the second insulating layer 24 in the HF solution is at least greater than 10:1.

Figure 9:
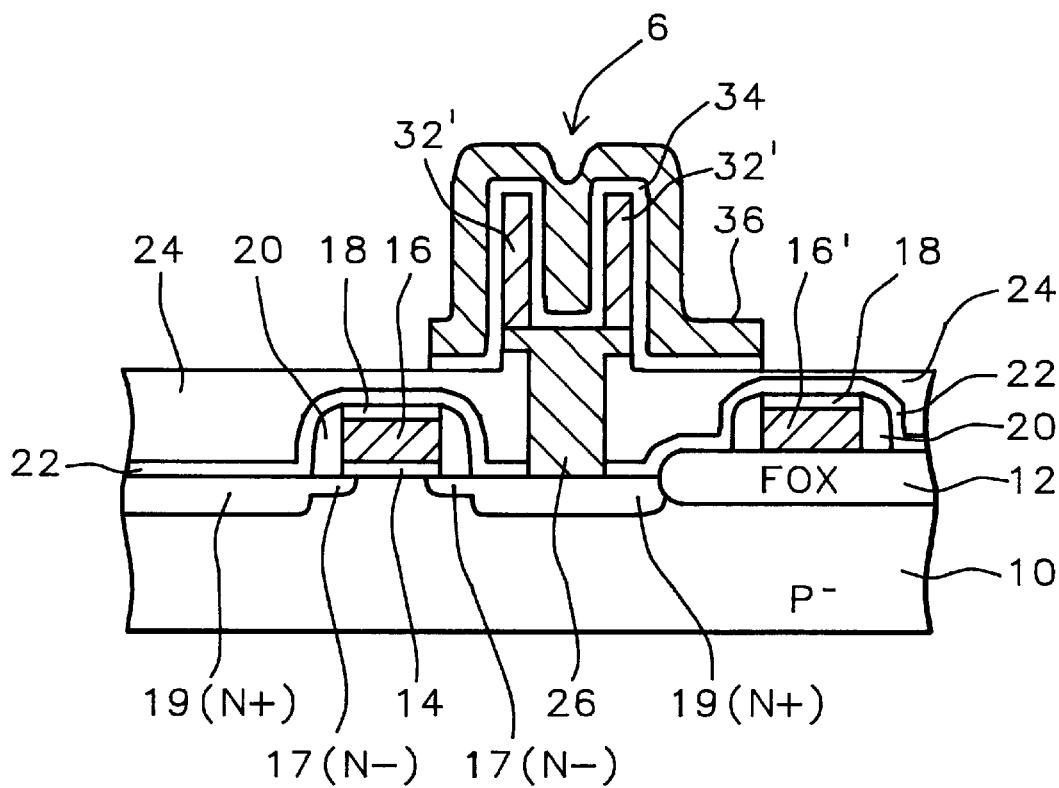

Referring to FIG. 9, the array of stacked capacitors is now completed by forming a thin capacitor dielectric layer 34 on the bottom electrodes composed of layers 26 and 32', and forming top electrodes from a third polysilicon layer 36. Layer 34 is a high-dielectric constant layer. This layer is typically composed of layers of $Si_3N_4/SiO_2$ (NO), or layers of $SiO_2/Si_3N_4/SiO_2$ (ONO). For example, the ONO dielectric can be formed by growing a thermal oxide on the bottom electrodes, depositing a $Si_3N_4$ layer by LPCVD, and then using an oxidation furnace to form the top $SiO_2$ by partially reducing the $Si_3N4$ layer. Preferably the ONO is formed having a thickness of between about 10 and 1000 Angstroms. Alternatively, layer 34 can be tantalum pentoxide $(Ta_2O_5)$ or can be used in conjunction with ONO or NO to form the high-dielectric-constant layer.

The third polysilicon layer 36 for the top electrodes is deposited by LPCVD using, for example, $SiH_4$, and deposited to a thickness of between about 1000 and 2000 Angstroms. The top electrodes are also heavily $N^+$ doped in situ with phosphorus to a concentration of between about 1.0 E 19 and 1.0 E 21 atoms/$cm^3$. Layer 36 is then patterned using conventional photolithographic techniques and anisotropic plasma etching to provide the top electrodes for the stacked storage capacitors having increased capacitance. Subsequent conventional processing to form bit lines and other interconnections (not shown in FIG. 9) can be carried out to complete the dynamic random access memory devices having these improved stacked capacitors formed under the bit lines to form capacitor under bit line (CUB) structures. It should be obvious to one skilled in the art that the method of this invention can also apply to capacitor over bit line (COB) structures by forming the bit lines prior to forming the capacitors.

While the invention has been particularly shown and described with reference to the preferred embodiment thereof, it will be understood by those skilled in the art that various changes in form and details may be made without departing from the spirit and scope of the invention.

What is claimed is:

1. A method for fabricating stacked capacitors having a high capacitance comprising the steps of:

forming field oxide areas on a semiconductor substrate while leaving device areas for fabrication of semiconductor devices;

forming device structures in and on said device areas of said semiconductor substrate;

depositing a first insulating layer over said device areas and said field oxide areas;

depositing a second insulating layer on said first insulating layer;

planarizing said second insulating layer;

forming contact openings in said first and second insulating layers to said device areas where electrical contacts are desired for said stacked capacitors; and forming said stacked capacitors by, depositing a first polysilicon layer over said device areas and said field oxide areas, and said first polysilicon layer contacting said device areas in said contact openings;

forming a third insulating layer on said first polysilicon layer;

patterning by anisotropic etching said third insulating layer and said first polysilicon layer to said second insulating layer leaving portions of said third insulating layer and said first polysilicon layer over said contact openings;

forming polysilicon oxide sidewalls by thermal oxidation on sidewalls of said portions of said first polysilicon layer while said third insulating layer prevents oxidation of the top surface of said portions of said first polysilicon layer;

etching selectively said third insulating layer and said portions of said first polysilicon layer leaving said polysilicon oxide sidewalls and recessing said portions of said first polysilicon layer over said contact openings;

depositing a second polysilicon layer;

anisotropically etching back said second polysilicon layer to form outer polysilicon spacers and inner polysilicon spacers on said polysilicon oxide sidewalls;

isotropically etching said polysilicon oxide sidewalls and concurrently etching portions of said second insulating layer to lift off said outer polysilicon spacers and to form bottom electrodes having vertical sidewalls formed from said inner polysilicon spacers for said stacked capacitors;

forming a capacitor dielectric layer on said bottom electrodes;

depositing and patterning a third polysilicon layer to form top electrodes to complete said stacked capacitors.

2. The method of claim 1, wherein said first insulating layer is composed of a silicon oxide layer and an upper silicon nitride layer having a total thickness of between about 1000 and 2000 Angstroms.

3. The method of claim 1, wherein said second insulating layer is a borophosphosilicate glass (BPSG) deposited by chemical vapor deposition and the thickness is between about 2000 and 8000 Angstroms.

4. The method of claim 1, wherein said first polysilicon layer is deposited to a thickness of between about 5000 and 10000 Angstroms.

5. The method of claim 1, where said third insulating layer is silicon nitride deposited to a thickness of between about 200 and 1000 Angstroms.

6. The method of claim 1, wherein said polysilicon oxide sidewalls are grown to a thickness of between about 100 and 1000 Angstroms.

7. The method of claim 1, wherein said second polysilicon layer is between about 500 and 2000 Angstroms thick.

8. The method of claim 1, wherein said capacitor dielectric layer is composed of a silicon oxide/silicon nitride/silicon oxide having a thickness of between about 10 and 1000 Angstroms.

9. The method of claim 1, wherein said third polysilicon layer has a thickness of between about 1000 and 2000 Angstroms.

10. The method of claim 1, wherein said first, second, and third polysilicon layers are conductively doped with an N type dopant.

11. The method of claim 1, wherein said isotropic etching is carried out in a hydrofluoric acid solution.

12. A method for fabricating dynamic random access memory (DRAM) devices having stacked capacitors with high capacitance comprising the steps of:

forming field oxide areas on a semiconductor substrate while leaving device areas for fabrication of field effect transistors;

forming a gate oxide layer on said device areas;

depositing and patterning an electrically conducting layer to form gate electrodes on said device areas;

forming source/drain areas adjacent to said gate electrodes to form said field effect transistors;

depositing a first insulating layer over said device areas and said field oxide areas;

depositing a second insulating layer on said first insulating layer;

planarizing said second insulating layer;

forming contact openings in said first and second insulating layers to said device areas where electrical contacts are desired for said stacked capacitors; and forming said stacked capacitors by, depositing a first polysilicon layer over said device areas and said field oxide areas, and said first polysilicon layer contacting said device areas in said contact openings;

forming a third insulating layer on said first polysilicon layer;

patterning by anisotropic etching said third insulating layer and said first polysilicon layer to said second insulating layer leaving portions of said third insulating layer and said first polysilicon layer over said contact openings;

forming polysilicon oxide sidewalls by thermal oxidation on sidewalls of said portions of said first polysilicon layer while said third insulating layer prevents oxidation of the top surface of said portions of said first polysilicon layer;

etching selectively said third insulating layer and said portions of said first polysilicon layer leaving said polysilicon oxide sidewalls and recessing said portions of said first polysilicon layer over said contact openings;

depositing a second polysilicon layer;

anisotropically etching back said second polysilicon layer to form outer polysilicon spacers and inner polysilicon spacers on said polysilicon oxide sidewalls;

isotropically etching said polysilicon oxide sidewalls and concurrently etching portions of said second insulating layer to lift off said outer polysilicon spacers and to form bottom electrodes having vertical sidewalls formed from said inner polysilicon spacers for said stacked capacitors;

forming a capacitor dielectric layer on said bottom electrodes;

depositing and patterning a third polysilicon layer to form top electrodes to complete said dynamic random access memory devices having said stacked capacitors.

13. The method of claim 12, wherein said first insulating layer is composed of a silicon oxide layer and an upper silicon nitride layer having a total thickness of between about 1000 and 2000 Angstroms.

14. The method of claim 12, wherein said second insulating layer is a borophosphosilicate glass (BPSG) deposited by chemical vapor deposition and the thickness is between about 2000 and 8000 Angstroms.

15. The method of claim 12, wherein said first polysilicon layer is deposited to a thickness of between about 5000 and 10000 Angstroms.

16. The method of claim 12, where said third insulating layer is silicon nitride deposited to a thickness of between about 200 and 1000 Angstroms.

17. The method of claim 12, wherein said polysilicon oxide sidewalls are grown to a thickness of between about 100 and 1000 Angstroms.

18. The method of claim 12, wherein said second polysilicon layer is between about 500 and 2000 Angstroms thick.

19. The method of claim 12, wherein said capacitor dielectric layer is composed of a silicon oxide/silicon nitride/silicon oxide having a thickness of between about 10 and 1000 Angstroms.

20. The method of claim 12, wherein said third polysilicon layer has a thickness of between about 1000 and 2000 Angstroms.

21. The method of claim 12, wherein said first, second, and third polysilicon layers are conductively doped with an N type dopant.

22. The method of claim 12, wherein said isotropic etching is carried out in a hydrofluoric acid solution.

23. The method of claim 12, wherein said electrically conducting layer is a polycide composed of an N doped polysilicon layer and a refractory metal silicide layer having a total thickness of between about 1500 and 3500 Angstroms.

* * * * *